United States Patent
Ziglioli et al.

(10) Patent No.: US 11,552,024 B2
(45) Date of Patent: Jan. 10, 2023

(54) METHOD OF MANUFACTURING QUAD FLAT NO-LEAD SEMICONDUCTOR DEVICES AND CORRESPONDING QUAD FLAT NO-LEAD SEMICONDUCTOR DEVICE

(71) Applicant: STMicroelectronics S.r.l., Agrate Brianza (IT)

(72) Inventors: Federico Giovanni Ziglioli, Pozzo d'Adda (IT); Alberto Pintus, Gessate (IT); Michele Derai, Millano (IT); Pierangelo Magni, Villasanta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 71 days.

(21) Appl. No.: 16/990,748

(22) Filed: Aug. 11, 2020

(65) Prior Publication Data
US 2021/0050299 A1   Feb. 18, 2021

(30) Foreign Application Priority Data

Aug. 16, 2019   (IT) .................... 102019000014829

(51) Int. Cl.
*H01L 23/538*   (2006.01)
*H01L 21/48*   (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............ H01L 21/4853; H01L 21/4857; H01L 21/565; H01L 21/561; H01L 21/568;
(Continued)

(56) References Cited

U.S. PATENT DOCUMENTS 9,330,994 B2   5/2016   Camacho et al.
2015/0279778 A1*   10/2015   Camacho ............ H01L 23/3107
257/737
(Continued)

FOREIGN PATENT DOCUMENTS

DE   102011007537 A1   10/2012
WO   WO 03015165 A2   2/2003

OTHER PUBLICATIONS

Fechtelpeter et al., "Reliability in MID—barriers, potentials, fields of action," 2016 12th International Congress Molded Interconnect Devices (MID), 6 pages.

*Primary Examiner* — Kyoung Lee
*Assistant Examiner* — Christina A Sylvia
(74) *Attorney, Agent, or Firm* — Seed Intellectual Property Law Group LLP

(57) ABSTRACT

A method of manufacturing semiconductor devices, such as integrated circuits includes arranging one or more semiconductor dice on a support surface. Laser direct structuring material is molded onto the support surface having the semiconductor die/dice arranged thereon. Laser beam processing is performed on the laser direct structuring material molded onto the support surface having the semiconductor die/dice arranged thereon to provide electrically conductive formations for the semiconductor die/dice arranged on the support surface. The semiconductor die/dice provided with the electrically-conductive formations are separated from the support surface.

20 Claims, 5 Drawing Sheets

(51) Int. Cl.
   *H01L 21/56* (2006.01)
   *H01L 23/31* (2006.01)
   *H01L 23/66* (2006.01)
   *H01L 23/00* (2006.01)
(52) U.S. Cl.
   CPC ........ *H01L 21/565* (2013.01); *H01L 23/3121* (2013.01); *H01L 23/5383* (2013.01); *H01L 23/5386* (2013.01); *H01L 23/66* (2013.01); *H01L 24/19* (2013.01); *H01L 24/20* (2013.01); *H01L 2223/6677* (2013.01); *H01L 2224/214* (2013.01)
(58) Field of Classification Search
   CPC ..... H01L 21/50; H01L 21/4814; H01L 21/56; H01L 21/76838; H01L 23/3121; H01L 23/5383; H01L 23/5386; H01L 23/66; H01L 23/5389; H01L 23/55; H01L 23/36772; H01L 23/3114; H01L 23/367; H01L 23/485; H01L 23/528; H01L 24/19; H01L 24/20; H01L 24/96; H01L 2223/6677; H01L 2224/214; H01L 2224/04105; H01L 2224/82103; H01L 2224/2518; H01L 2924/12041; H01L 2324/14

See application file for complete search history.

(56) References Cited

U.S. PATENT DOCUMENTS

| | | |
|---|---|---|
| 2016/0071788 A1 | 3/2016 | Lohia et al. |
| 2016/0300779 A1 | 10/2016 | Watanabe et al. |
| 2018/0342433 A1 | 11/2018 | Ziglioli et al. |
| 2018/0342434 A1 | 11/2018 | Ziglioli |
| 2018/0366407 A1* | 12/2018 | Ooi .................. H01L 23/50 |
| 2019/0115287 A1 | 4/2019 | Derai et al. |
| 2020/0381380 A1 | 12/2020 | Lee et al. |
| 2021/0050226 A1 | 2/2021 | Derai et al. |

* cited by examiner

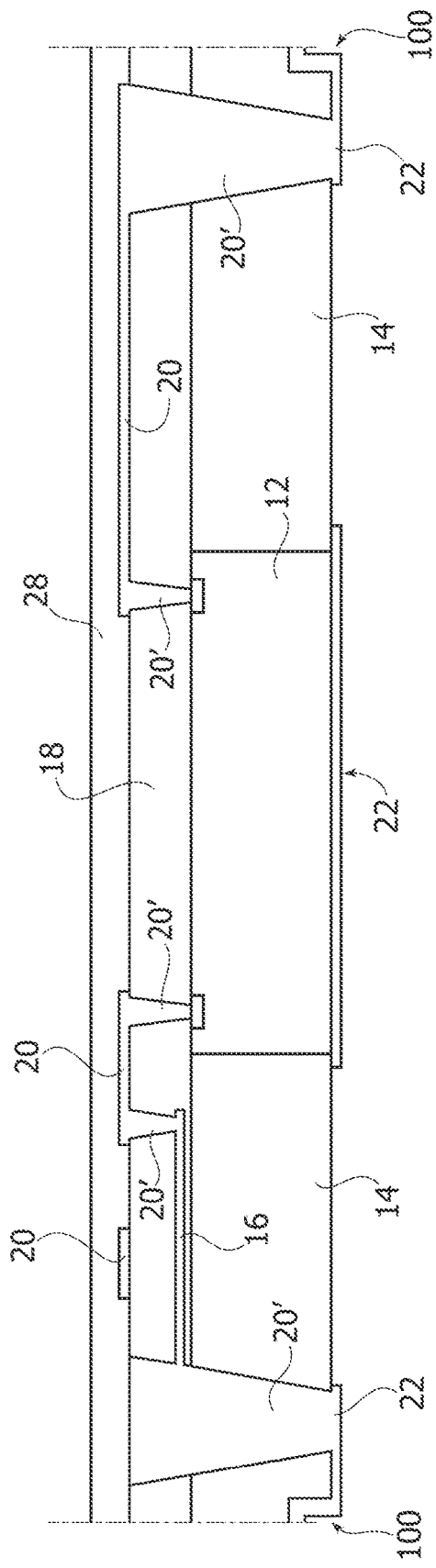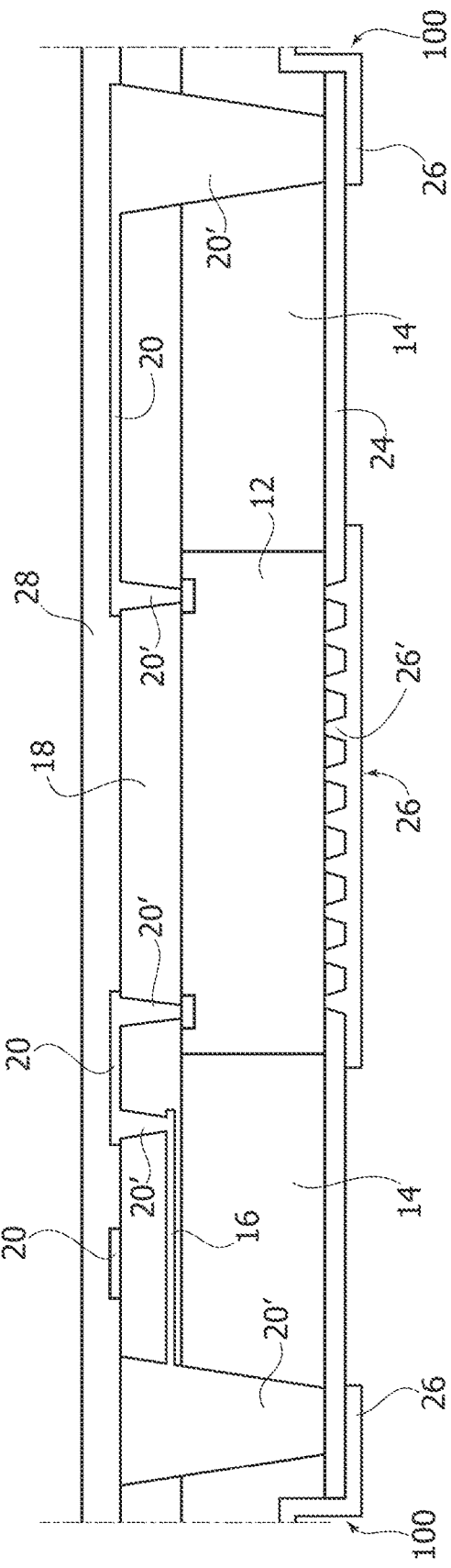

US 11,552,024 B2

METHOD OF MANUFACTURING QUAD FLAT NO-LEAD SEMICONDUCTOR DEVICES AND CORRESPONDING QUAD FLAT NO-LEAD SEMICONDUCTOR DEVICE

BACKGROUND

Technical Field

The description relates to manufacturing semiconductor devices.

One or more embodiments may be applied to manufacturing semiconductor devices such as integrated circuits (ICs), for instance.

Description of the Related Art

Various technologies are currently available for manufacturing semiconductor devices such as, for instance, QFN (Quad Flat No-lead) semiconductor devices.

Desirable features in that technical field may include:
reduced assembly cost;
leadframe replaced with a custom-made substrate;
high flexibility in substrate manufacturing;
modular configuration for multiple dice; and/or
capability of possibly dispensing with wire bonding.

BRIEF SUMMARY

The present disclosure provides various embodiments which contribute in providing further improvements along the lines discussed in the foregoing.

According to one or more embodiments, various advantages may be achieved by means of a method having the features set forth in the claims that follow.

One or more embodiments may relate to a corresponding semiconductor device (an integrated circuit, for instance).

One or more embodiments may offer one or more of the following advantages:
low-cost structure;
possibility of avoiding wire bonding;
good thermal performance;
possibility of using a plastic leadframe; and/or
solder joint inspection facilitated.

In one or more embodiments, the present disclosure provides a method that includes: arranging at least one semiconductor die on a support surface; molding laser direct structuring material onto the support surface having the at least one semiconductor die arranged thereon; laser beam processing the laser direct structuring material molded onto the support surface having at least one semiconductor die arranged thereon to provide electrically conductive formations for the at least one semiconductor die arranged on the support surface; and separating from the support surface the at least one semiconductor die provided with the electrically-conductive formations.

In one or more embodiments, the present disclosure provides a semiconductor device that includes at least one semiconductor die provided with electrically conductive formations formed according to the methods described herein. The semiconductor device further includes package molding material molded onto the at least one semiconductor die, the package molding material encapsulating the at least one semiconductor die and at least part of the electrically conductive formations provided thereon.

In one or more embodiments, the present disclosure provides a method that includes: forming a first layer of laser direct structuring material on a surface of a substrate, a plurality of semiconductor dice positioned on the surface of the substrate; forming first electrically conductive structures on the first layer of laser direct structuring material by laser beam processing the first layer of laser direct structuring material, the first electrically conductive structures electrically coupled to the plurality of semiconductor dice; and separating the plurality of semiconductor dice and the first electrically conductive structures from the surface of the substrate.

BRIEF DESCRIPTION OF THE SEVERAL VIEWS OF THE DRAWINGS

One or more embodiments will now be described, by way of example only, with reference to the annexed figures, wherein:

FIG. 2 is a cross-sectional view across a semiconductor device according to embodiments;

FIG. 3 is a cross-sectional view across a semiconductor device according to embodiments;

Figure 1A:
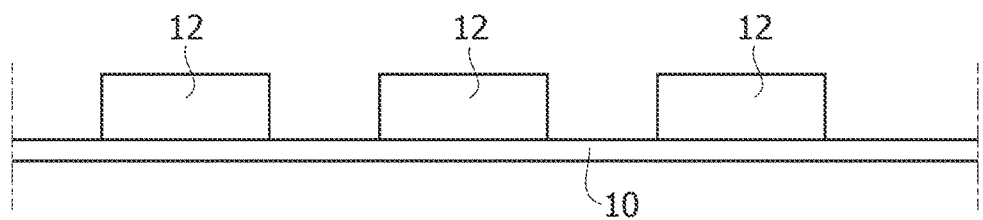
FIGS. 1A to 1I are exemplary of possible acts in a method according to embodiments.

It will be appreciated that, for the sake of clarity and ease of representation, the various figures may not be drawn to a same scale.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Laser Direct Structuring (LDS) is a laser-based machining technique now widely used in various sectors of the industrial and consumer electronics markets, for instance for high-performance antenna integration, where an antenna design can be directly formed onto a molded plastic part.

In an exemplary process, the molded parts can be produced with commercially available resins which include additives suitable for the LDS process; a broad range of resins such as polymer resins like PC, PC/ABS, ABS, LCP are currently available for that purpose.

In LDS, a laser beam can be used to transfer a desired electrically-conductive pattern onto a plastic molding which may then be subjected to metallization (for instance via electroless plating with copper or other metals) to finalize a desired conductive pattern.

One or more embodiments as exemplified herein are based on the recognition that LDS facilitates providing electrically-conductive formations such as vias and lines in a molding compound, without further manufacturing steps and with a high flexibility in the shapes which can be obtained.

One or more embodiments can be applied to various types of semiconductor devices such as (by way of a non-limiting examples) those semiconductor devices currently referred to as QFN, QFN being an acronym for Quad Flat Pack No-lead.

One or more embodiments may facilitate providing semiconductor devices which do not include a leadframe. The designation "leadframe" (or "lead frame") is currently used (see for instance the USPC Consolidated Glossary of the United States Patent and Trademark Office) to indicate a metal frame which provides support for an integrated circuit chip or die as well as electrical leads to interconnect the integrated circuit in the die or chip to other electrical components or contacts.

One or more embodiments may be based on the recognition that integrating electronic functionalities on EMC (Epoxy Molding Compound) encapsulated semiconductor package devices may add value through increased density at package level 1: see, for instance, C. Fechtelpeter, et al.: "Reliability in MID—barriers, potentials, field of action", Proceedings of the 2016 12th International Congress Molded Interconnect Devices (MID 2016), Wuerzburg, Germany, 28-29 Sep. 2016, pp. 88-93 (ISBN 978-1-5090-5429-9).

Also, the technology known as LDS—MID may facilitate integration of electrical circuitry directly onto a chip package housing. This may include, for instance, AoP (Antenna-on-Package) solutions possibly in combination with package-on-package (PoP) solutions and/or selective or conformal shielding resulting in increased functional density (size and cost reduction).

Such solutions may take advantage of state-of-the-art overmolding material for protecting IC packages from environmental stress while also facilitating (very) high selective metallization and adhesion strength (>20 N/mm$^2$), high temperature resistance and low CTE (thermal expansion) as well as satisfactory RF (Radio frequency) properties and high-frequency performance.

Such solutions may also take advantage of developments in compression molding and transfer molding techniques in conjunction with the possibility of providing micro-vias (Through Mold Vias) by resorting to LDS technology.

One or more embodiments as exemplified herein may involve providing a temporary (sacrificial) support tape (comprising, for instance, the polyimide tape material currently referred to as Kapton) onto which one or more semiconductor chips or dice can be attached and then molded with an LDS compound.

Die attachment onto the tape may involve any technique known for that purpose to those of skill in the art.

Also, the LDS compound may comprise any of a broad range of LDS materials such as, for instance, resins such as polymer resins like PC, PC/ABS, ABS, LCP as currently available on the market.

After molding the LDS compound, laser structuring of traces and vias as desired may be performed—possibly repeatedly—to create an (even quite complex) routing of electrically-conductive formations which may include a plurality of (N+1) layers.

In one or more embodiments, the sacrificial tape can thereafter be removed (that is the die or dice can be separated from the tape) with the possibility of creating lands for soldering at the back side of the structure thus provided.

One or more embodiments may comprise the acts exemplified in FIGS. 1A to 1I, where simultaneous manufacturing of plural semiconductor devices to be eventually singulated as discussed in the following is assumed to take place as otherwise conventional in the art.

FIG. 1A is exemplary of an act of providing a (sacrificial) support tape 10 as discussed previously onto which one or more semiconductor chips or dice 12 can be attached in a manner known to those skill in the art.

Figure 1B:
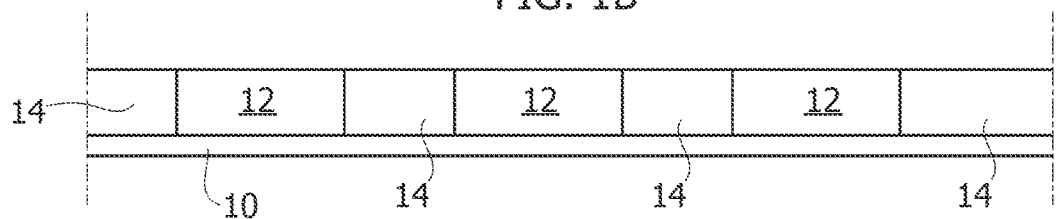

FIG. 1B is exemplary of an act of molding LDS material 14 onto the tape 10 having the dice 12 arranged thereon; as noted, a range of commercially available resins including additives suitable for the LDS process (PC, PC/ABS, ABS, LCP as currently available with various suppliers) may be used for that purpose.

Figure 1C:
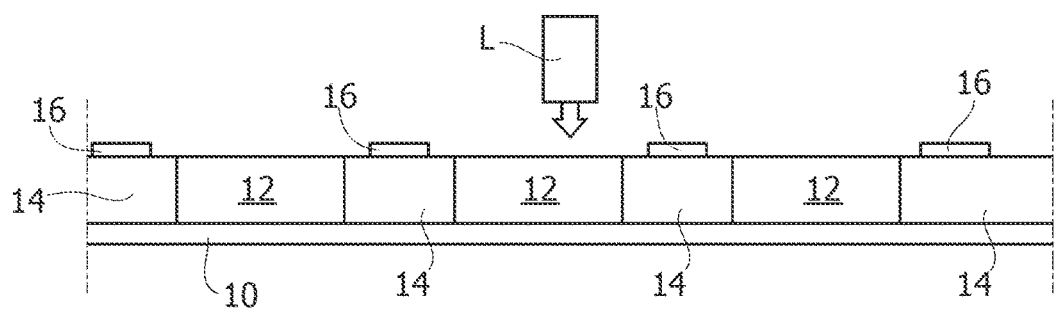

FIG. 1C is exemplary of an act of LDS processing the LDS material 14 (laser beam activation L plus possible metallization such as plating to facilitate or increase electrical conductivity as conventional in the art) in order to provide a first layer of electrically-conductive formations 16.

Figure 1D:
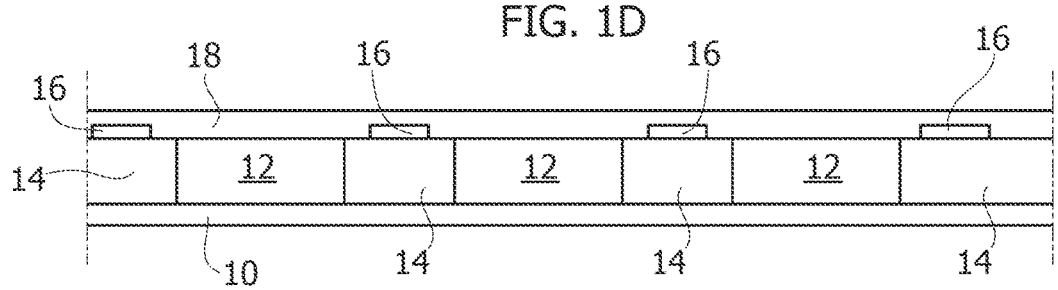

FIG. 1D is exemplary of an act of molding on the resulting structure of FIG. 1C further LDS material 18 (same as or different from 14).

Figure 1E:
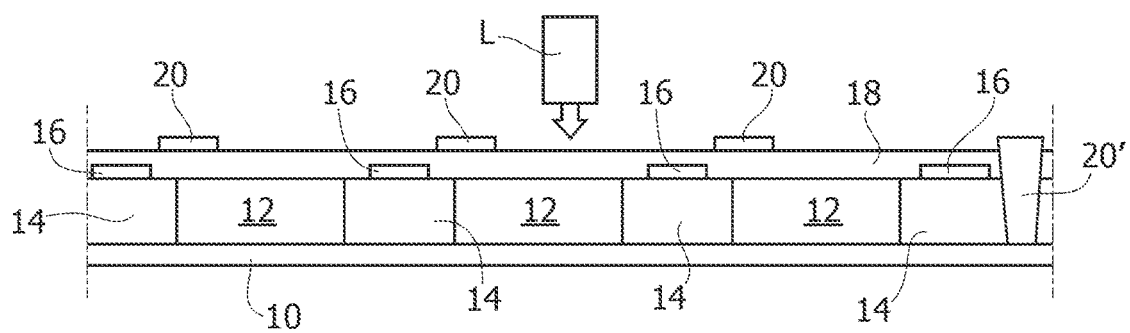

FIG. 1E is exemplary of an act of LDS processing the further LDS material 18 (laser beam activation L plus possible metallization such as plating to facilitate or increase electrical conductivity as conventional in the art) to provide a further layer of electrically-conductive formations 20. As exemplified herein, such LDS processing may include the possible formation of electrical-conductive vias 20' extending through the thickness of the layers 14 and/or 18.

Figure 1F:
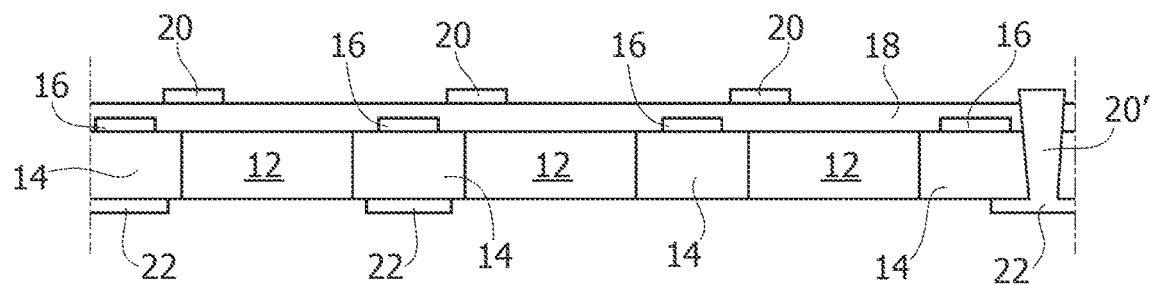

FIG. 1F is exemplary of an act of removing the sacrificial support plate 10 thus separating the resulting structure of FIG. 1E from the tape 10 with possible formation (growth) of electrically-conductive formations 22 at the "back" side of the structure.

Figure 1G:
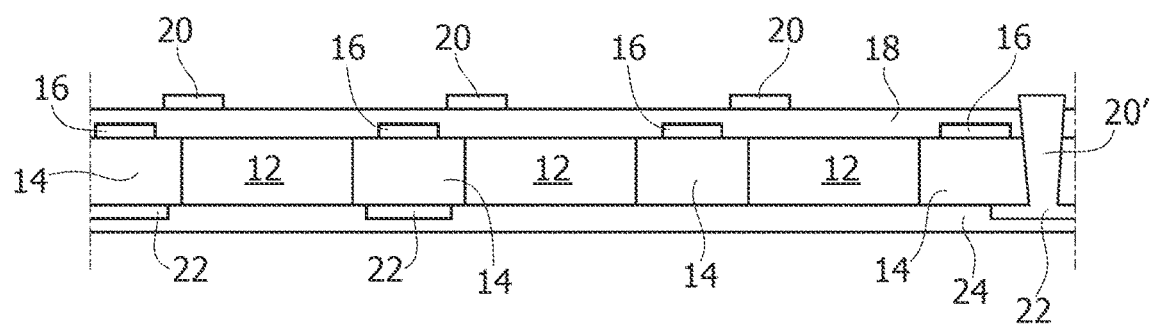

FIG. 1G is exemplary of an (optional) act of molding still further LDS material 24 (same as or different from 14 and 18) onto the back side of the structure of FIG. 1F.

Figure 1H:
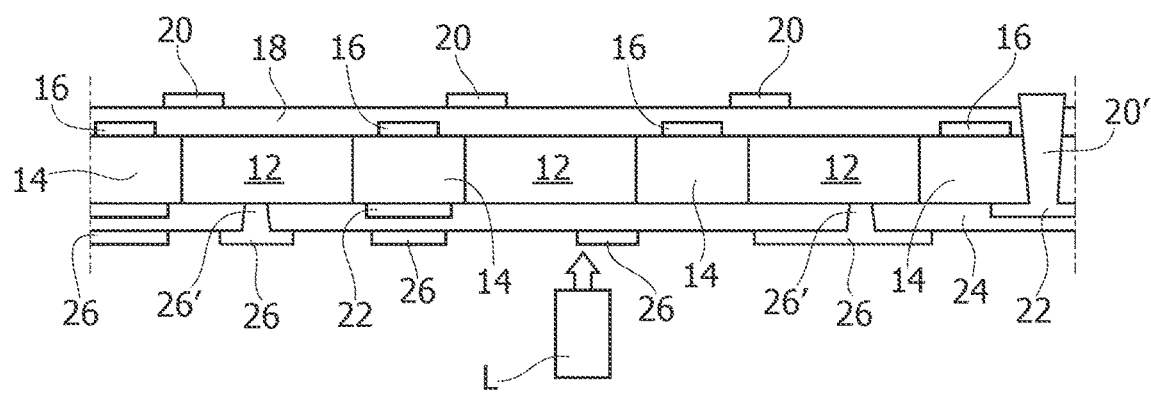

FIG. 1H is exemplary of an (optional) act of LDS processing the LDS material 24 (laser beam activation L plus possible metallization such as plating to facilitate or increase electrical conductivity as conventional in the art) to provide a layer of electrically-conductive formations 26 at the back side of the structure of FIG. 1F. As exemplified herein, such LDS processing may include the possible formation of electrical-conductive vias 26' extending through the thickness of the layer 24 to the chips or dice 12.

Figure 1I:
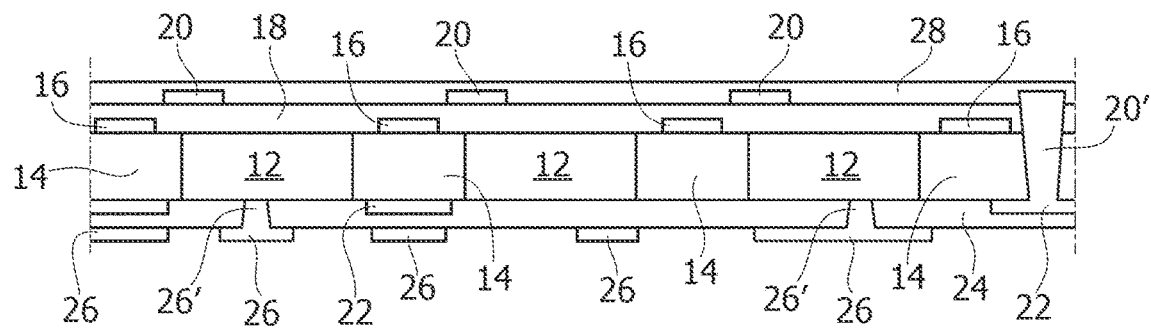

FIG. 1I is exemplary of an act of encapsulating the front (top) and/or bottom (back) surface of the structure as exemplified at 28 by jet printing, sheet molding or other known technologies.

One or more embodiments as exemplified herein facilitate the provision of a complex 3D routing of electrically-conductive formations (see 16, 20, 20',26, 26', for instance) using LDS material. This facilitates avoiding (or at least reducing) electrical wiring with the possibility of providing different layers of metal-plated traces with the different thicknesses.

In some embodiments, formation of the electrically-conductive formations (see 16, 20, 20',26, 26', for instance) may comprise an additional step of metallization (e.g., by plating or the like) to form an electrically-conductive material on or in regions of the LDS material which has been processed to form the electrically-conductive formation pattern (see 16, 20, 20',26, 26', for instance). The metallization may facilitate or provide suitable electrical conductivity of the electrically-conductive formations, for example, by increasing the electrical conductivity of the electrically-conductive formations as may be desired for use in the semiconductor devices provided herein.

In one or more embodiments, using a (metal) leadframe can be avoided.

In one or more embodiments, EMI (ElectroMagnetic Interference) shielding can be provided between layers.

FIGS. 2 and 3 are cross-sectional views exemplary of semiconductor devices which can be produced as exemplified previously. FIG. 3 is exemplary of embodiments including the optional acts exemplified in FIGS. 1G and 1H.

In FIGS. 2 and 3 parts or elements like parts or elements already discussed in connection with FIGS. 1A to 1I are indicated by like reference symbols. A detailed description will not be repeated here for brevity.

In an arrangement as exemplified in FIG. 3 metal growth at the backside of the semiconductor die or dice 12 as exemplified at 22 may take into account the possible presence of a metallization on the back or bottom side of the semiconductor die or dice 12 with a dedicated routing to be removed later.

As known to those of skill in the art, a semiconductor die such as 12 may be provided with a metallization at its bottom (back) surface, such as a few nanometer of gold, for instance. This metallization may be produced in die fabrication with the aim of facilitating good electrical performance once soldered onto a printed circuit board or PCB, with the possibility, if a ground connection is desired between this metallization and any point of an associated leadframe, of growing a (thick) copper layer; after this act, ground connection can be removed or disconnected from the rest of the leadframe during package singulation.

Embodiments as exemplified in FIGS. 2 and 3 may include one layer of electrically-conductive formations 18 provided onto the "first" LDS layer 14. One or more embodiments may involve plural such further layers of a LDS material being provided onto the front or top side of the device. This may result in a stacked arrangement of at least three layers of electrically-conductive formations for the semiconductor die or dice 12.

Both FIGS. 2 and 3 are exemplary at 100 of the possibility of providing "half-cut" lines obtained by laser beam processing of the LDS material (in layer 14). Again, this may be followed by deposition of electrically-conductive material (metal for instance, applied by known processes such as plating) thereby facilitating solder inspection.

These half-cut lines (wettable flanks) can be created through laser etching the LDS material 14. Then individual packages can be obtained via "singulation" which can occur via conventional tools such as a sawing blade.

Figure 5:
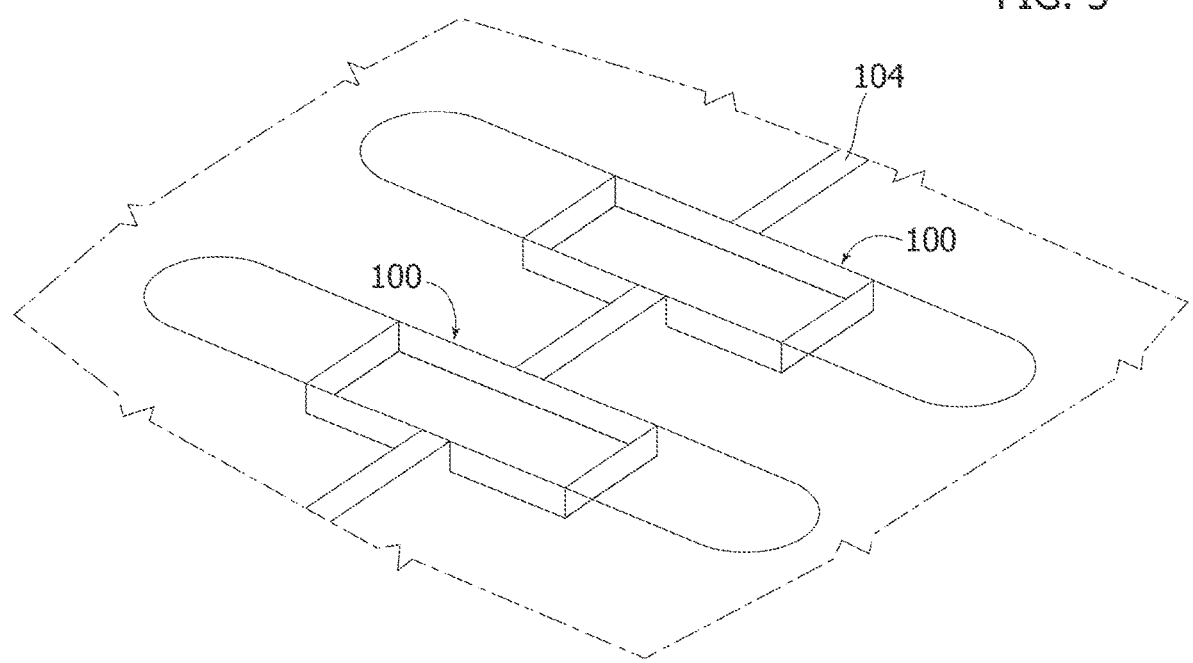
FIG. 5 a more detailed view of a portion of FIG. 4 as indicated by arrow V.

As exemplified in FIG. 5, such wettable flanks can be produced via (strong) laser penetration of laser beam into the LDS material (about 100 micron etching, for instance).

As exemplified in FIG. 5, the pits thus formed may have lines 104 of light(er) laser penetration (a few micron etching, for instance) extending therebetween.

Figure 4:
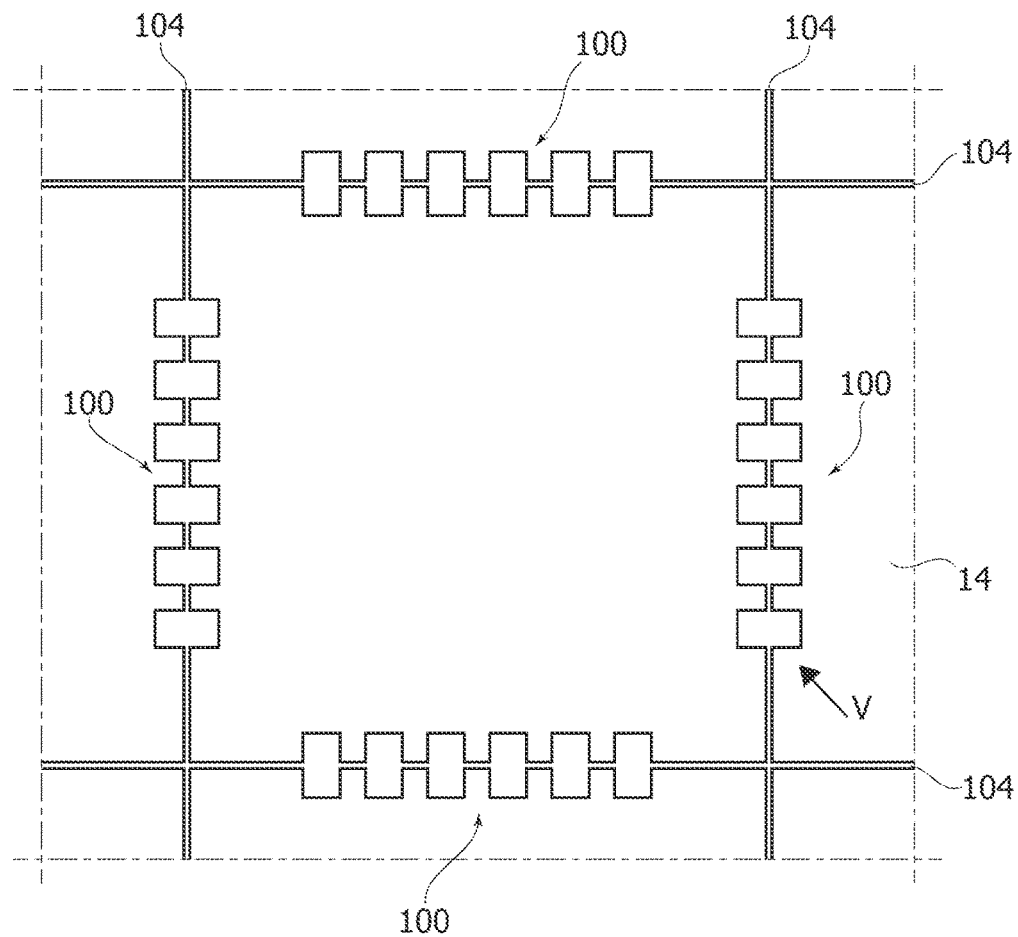
FIG. 4 is a plan view of certain elements of a semiconductor device exemplary of embodiments.
Figure 6:
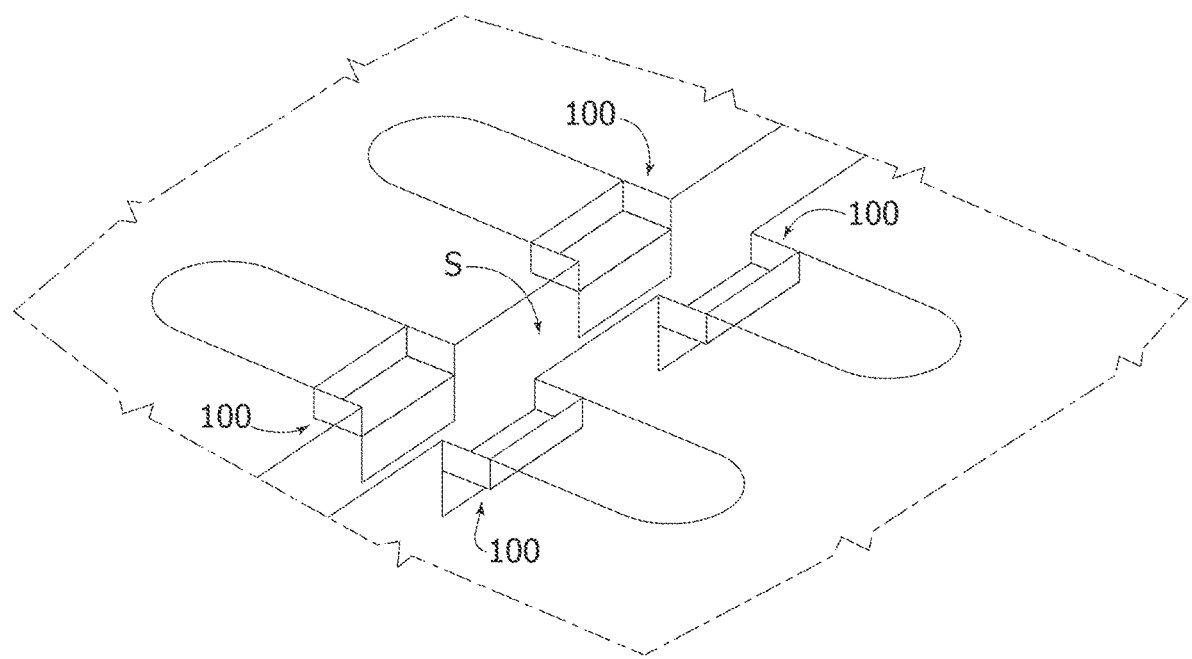
FIGS. 6 and 7 are exemplary views, substantially corresponding to the view of FIG. 5, exemplary of certain possible acts in embodiments.

FIG. 6 exemplifies the possible result of "singulation" of semiconductor devices produced and discussed in the foregoing. As discussed, singulation may involve any known singulation means (represented by an arrow S) the possibility of removing plating at 104 in FIG. 4, as intended in conventional singulation to remove so-called bus bars connected to a leadframe structure to short-circuit the leads in the leadframe, facilitating plating growth by electrolytic processes, for instance.

Figure 7:
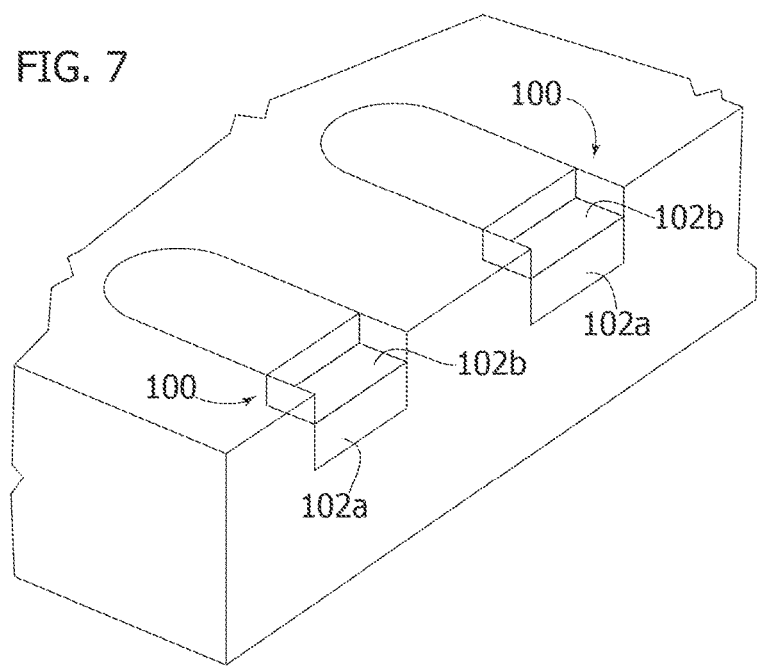

FIG. 7 is exemplary of the possible result of singulation at a side of an individual semiconductor device. FIG. 7 also exemplifies the deposition of electrically-conductive material (metallization via plating, for instance) at the surfaces of the half-cuts (wettable flanks) 100. This may include, for instance, Cu-only plating as exemplified at 102a at the bottom of the cuts and Cu plating plus tin plating as exemplified at 102b.

It will be appreciated that FIG. 3 can be also regarded as exemplary of the possibility for the LDS handling at the backside of the semiconductor die or dice 12 of exploiting the thermal conductivity of the electrically-conductive region 26, 26' resulting from LDS processing of the layer 24 at the backside of the semiconductor die or dice 12 to produce a consolidated arrangement of thermally conductive vias and a thermally conductive pad adapted to operate as a heat sink and/or to facilitate heat dissipation.

A method as exemplified herein may comprise:
providing a support surface (for instance, a tape such as 10);
arranging on said support surface at least one semiconductor die (for instance, an LED 12);
molding laser direct structuring material (for instance, 14) onto the support surface having the at least one semiconductor die arranged thereon;
laser beam processing (for instance, L) the laser direct structuring material molded onto the support surface having at least one semiconductor die arranged thereon to provide electrically conductive formations (for instance, 16) for the at least one semiconductor die arranged on said support surface; and
separating from said support surface said at least one semiconductor die provided with said electrically-conductive formations.

A method as exemplified herein may comprise:
i) molding further laser direct structuring material (for instance, 18) onto said at least one semiconductor die provided with said electrically-conductive formations; and
ii) laser beam processing said further laser direct structuring material to provide further electrically-conductive formations for said at least one semiconductor die.

A method as exemplified herein may comprise repeating said acts i) and ii) to provide a stacked arrangement of a plurality of layers of electrically-conductive formations for said at least one semiconductor die.

A method as exemplified herein may comprise, subsequent to separating from said support surface (for instance, 10) said at least one semiconductor die provided with said electrically-conductive formations:
molding additional laser direct structuring material (24) onto said at least one semiconductor die (12) opposite said electrically-conductive formations; and
laser beam processing (for instance, L) said additional laser direct structuring material to provide additional electrically-conductive formations for the at least one semiconductor die opposite said electrically-conductive formations.

A method as exemplified herein may comprise, subsequent to separating from said support surface (for instance, 10) said at least one semiconductor die provided with said electrically-conductive formations, laser beam processing said laser direct structuring material opposite said electrically-conductive formations thereby providing solder-wettable formations (for instance, 100) therein.

In a method as exemplified herein, said laser beam processing may comprise:
applying laser beam energy to provide at least one electrically-conductive formation pattern; and
applying (plating, for instance) electrically-conductive material onto said at least one electrically-conductive formation pattern.

A semiconductor device as exemplified herein may comprise:
at least one semiconductor die provided with electrically-conductive formations with the method of any of claims 1 to 6; and
package molding material (for instance, Epoxy Molding Compound as exemplified at 28) molded onto the at least one semiconductor die to encapsulate the at least one semiconductor die and at least part of the electrically-conductive formations provided thereon.

One or more embodiments as exemplified herein may lend themselves to being practiced in conjunction with a solution for manufacturing semiconductor devices as disclosed in an Italian patent application filed on even date in the name of the same Assignee.

Without prejudice to the underlying principles, the details and the embodiments may vary, even significantly, with respect to what has been described by way of example only without departing from the scope of the embodiments.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
arranging a semiconductor die on a support surface;
molding a first laser direct structuring material onto the support surface that has the semiconductor die arranged thereon;
providing electrically conductive formations for the semiconductor die by laser beam processing the first laser direct structuring material on the support surface;
forming wettable flanks extending partially into the first laser direct structuring material from a surface of the first laser direct structuring material that is opposite the electrically conductive formations; and
separating from the support surface the semiconductor die having the electrically-conductive formations.

2. The method of claim 1, comprising:
molding a second laser direct structuring material onto the semiconductor die having the electrically conductive formations; and
providing further electrically conductive formations for the semiconductor die by laser beam processing the second laser direct structuring material.

3. The method of claim 2, comprising forming a stacked arrangement of a plurality of layers of electrically conductive formations for the semiconductor die by repeatedly performing the molding the second laser direct structuring material and the laser beam processing the second laser direct structuring material.

4. The method of claim 1, comprising, subsequent to separating from the support surface the semiconductor die provided with the electrically conductive formations:
molding a second laser direct structuring material onto the semiconductor die opposite the electrically conductive formations; and
providing additional electrically conductive formations for the semiconductor die opposite the electrically conductive formations by laser beam processing the second laser direct structuring material.

5. The method of claim 1, wherein the forming the wettable flanks is performed subsequent to the separating from the support surface the semiconductor die provided with the electrically conductive formations, and the forming the wettable flanks includes laser beam processing the first laser direct structuring material opposite the electrically conductive formations thereby providing the wettable flanks therein.

6. The method of claim 1, wherein the laser beam processing comprises:
applying laser beam energy to provide an electrically conductive formation pattern; and
applying an electrically conductive material onto the electrically conductive formation pattern.

7. A semiconductor device, comprising:
a semiconductor die on a support surface;
a first laser direct structuring material on the support surface having the semiconductor die;
electrically conductive formations formed by laser beam processing the first laser direct structuring material on the support surface;
wettable flanks extending partially into the first laser direct structuring material from a surface of the first laser direct structuring material that is opposite the electrically conductive formations; and
package molding material molded onto the semiconductor die, the package molding material encapsulating the semiconductor die and at least part of the electrically conductive formations.

8. The semiconductor device of claim 7, wherein at least some of the electrically conductive formations extend through the first laser direct structuring material.

9. The semiconductor device of claim 7, wherein the laser beam processing the first laser direct structuring material includes forming cavities in the first laser direct structuring material, and the electrically conductive formations include an electrically conductive material on surfaces of the cavities in the first laser direct structuring material.

10. The semiconductor device of claim 7, comprising:
a layer of a second laser direct structuring material molded onto the semiconductor die; and
second electrically conductive formations on the layer of the second laser direct structuring material.

11. The semiconductor device of claim 10, wherein at least some of the second electrically conductive formations extend through the layer of the second laser direct structuring material.

12. The semiconductor device of claim 10, wherein the electrically conductive formations are spaced apart from the second electrically conductive formations by the semiconductor die.

13. A method, comprising:
forming a first layer of a laser direct structuring material on a surface of a substrate, a plurality of semiconductor dice positioned on the surface of the substrate;
forming a first electrically conductive structures on the first layer of the laser direct structuring material by laser beam processing the first layer of the laser direct structuring material, the first electrically conductive structures electrically coupled to the plurality of semiconductor dice;
forming wettable flanks extending partially into the first layer of the laser direct structuring material from a surface of the laser direct structuring material that is opposite the first electrically conductive formations; and
separating the plurality of semiconductor dice and the first electrically conductive structures from the surface of the substrate.

14. The method of claim 13, wherein the substrate is a support tape.

15. The method of claim 13, wherein the forming the first layer of the laser direct structuring material includes forming the first layer of the laser direct structuring material between adjacent ones of the plurality of semiconductor dice.

16. The method of claim 13, wherein the forming the first electrically conductive structures includes:
forming a plurality of cavities in the first layer of the laser direct structuring material by the laser beam processing; and
forming an electrically conductive layer on surfaces of the laser direct structuring material in the plurality of cavities.

17. The method of claim 13, wherein the first electrically conductive structures include a plurality of electrically conductive vias.

18. The method of claim 13, further comprising:
forming a second layer of the laser direct structuring material on the first layer of the laser direct structuring material and on the plurality of semiconductor dice; and
forming second electrically conductive structures on the second layer of the laser direct structuring material by laser beam processing the second layer of the laser direct structuring material, the second electrically conductive structures electrically coupled to the plurality of semiconductor dice.

19. The method of claim 18, wherein the forming the second electrically conductive structures includes forming the second electrically conductive structures extending completely through the second layer of the laser direct structuring material.

20. The method of claim 13, further comprising:
forming a second layer of the laser direct structuring material on a surface of the substrate that is opposite the first layer of the laser direct structuring material; and
forming second electrically conductive structures on the second layer of the laser direct structuring material by laser beam processing the second layer of the laser direct structuring material, the second electrically conductive structures electrically coupled to the plurality of semiconductor dice.

* * * * *